United States Patent
Wu

(10) Patent No.: US 9,455,733 B1
(45) Date of Patent: Sep. 27, 2016

(54) SYSTEM AND METHOD FOR SPREAD SPECTRUM ADC NOISE REDUCTION

(71) Applicant: Broadcom Corporation, Irvine, CA (US)

(72) Inventor: Jiangfeng Wu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/699,866

(22) Filed: Apr. 29, 2015

Related U.S. Application Data

(60) Provisional application No. 62/140,117, filed on Mar. 30, 2015.

(51) Int. Cl.
| | |
|---|---|
| *H03M 1/06* | (2006.01) |
| *H03M 1/12* | (2006.01) |
| *H03M 1/46* | (2006.01) |
| *H04B 1/69* | (2011.01) |
| *H04L 1/00* | (2006.01) |

(52) U.S. Cl.
CPC ........... *H03M 1/0609* (2013.01); *H03M 1/121* (2013.01); *H03M 1/1245* (2013.01); *H03M 1/46* (2013.01); *H03M 1/462* (2013.01); *H04B 1/69* (2013.01); *H04L 1/0071* (2013.01)

(58) Field of Classification Search
CPC .. H03M 1/0604; H03M 1/1023; H03M 1/12; H03M 1/00; H03M 3/34; H03M 1/462; H03M 1/0609; H03M 1/121; H03M 1/46; H03M 1/1245; H04B 1/719; H04B 1/717; H04B 1/709; H04B 1/7174
USPC ........................... 341/118, 155; 375/141–147
See application file for complete search history.

(56) References Cited

U.S. PATENT DOCUMENTS

| | | | | |
|---|---|---|---|---|
| 5,432,815 A | * | 7/1995 | Kang .................... | H04B 1/707 375/141 |
| 6,559,787 B1 | * | 5/2003 | Aude .................... | H03K 3/013 341/156 |
| 6,693,486 B1 | * | 2/2004 | Brockhaus ............... | G01F 1/60 330/124 R |
| 7,953,168 B2 | * | 5/2011 | Sakai ............... | H04L 25/03057 375/147 |
| 8,884,804 B1 | * | 11/2014 | Majumdar ........... | G04F 10/005 341/120 |
| 2003/0210166 A1 | * | 11/2003 | Liu ......................... | H03M 3/34 341/172 |
| 2009/0016735 A1 | * | 1/2009 | Schmitz .................. | G01V 8/12 398/140 |
| 2012/0326901 A1 | * | 12/2012 | Zhao .................... | H03M 1/0604 341/118 |
| 2014/0142447 A1 | * | 5/2014 | Takahashi ........... | H03F 3/45475 600/509 |
| 2014/0240158 A1 | * | 8/2014 | Ishii .................... | H03M 1/1023 341/161 |
| 2015/0116557 A1 | * | 4/2015 | Choi .................... | H04N 5/3575 348/294 |

* cited by examiner

*Primary Examiner* — Lam T Mai

(57) ABSTRACT

Methods, systems, and apparatuses, including electrical circuits, are described for spread spectrum ADC noise reduction. An analog-to-digital converter may include an analog modulator to modulate an input analog signal according to a pseudo-noise sequence. An ADC core may convert the modulated analog input signal to a digital signal representation thereof. The digital signal may be demodulated using the pseudo-noise sequence to generate a noise-spread signal with reduced noise spectral density. The analog modulator and digital demodulator may also be configured in an analog-to-digital converter that includes a comparator and successive approximation register (SAR) logic, rather than an ADC core, in a SAR implementation. Multi-lane, interleaved analog-to-digital conversion circuits are also described using the inventive techniques. Analog-to-digital converters including DC offset components and methods performed according to the inventive techniques are also described.

20 Claims, 8 Drawing Sheets

SYSTEM AND METHOD FOR SPREAD SPECTRUM ADC NOISE REDUCTION

CROSS-REFERENCE TO RELATED APPLICATIONS

This application claims the benefit of U.S. Provisional Application No. 62/140,117, filed on Mar. 30, 2015, the entirety of which is incorporated by reference herein.

BACKGROUND

I. Technical Field

Embodiments described herein relate to spread spectrum ADC (analog-to-digital converter) noise reduction.

II. Background Art

Various existing products and services use analog-to-digital (A/D) converters (ADCs) for analog-to-digital conversion operations. However, transistor noise (e.g., "1/f" or low-frequency noise, e.g., 100 kHz-1 MHz or 1 MHz-10 MHz by system) becomes more severe with technology downward scaling and poses a steep trade-off with other design objectives such as speed and power. ADC 1/f noise often does not significantly affect the integrated noise and the overall signal-to-noise ratio (SNR), however low-frequency noise degrades the SNR within the low frequency range which is problematic in some systems. Additionally, typical interleaved ADCs up-convert low-frequency noise to the multiples Fs/N (where Fs is the combined frequency of the interleaved lanes and N is the interleaving factor) which degrades the narrow-band SNR around the multiples of Fs/N. This may cause problems such as channel SNR degradation in some systems.

Various techniques have been used to compensate for ADC low-frequency noise. For example, transistor sizes may be scaled up to reduce low-frequency noise, though this leads to larger transistors, which may degrade other aspects of circuit performances such as speed and power. Correlated double sampling (CDS) techniques sample noise before sampling the signal plus noise in order to remove the noise, though they reduce the sample rate of the signal by half and increase the high-frequency noise present in the system. Auto-zeroing senses the low-frequency noise in a calibration phase and subtracts the noise during the normal operation, but the extra calibration phase reduces the conversion speed and the subtraction may introduce additional noise. Chopper stabilization (or chopping) modulates the signal with a fixed frequency square wave and shifts the low-frequency noise to a higher frequency, though it does not work for Nyquist ADCs. Interleaved ADC randomization with redundant lanes can be used, but leads to larger area, higher power, and clocking complexity.

BRIEF SUMMARY

Methods, systems, and apparatuses are described for spread spectrum ADC noise reduction, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1:
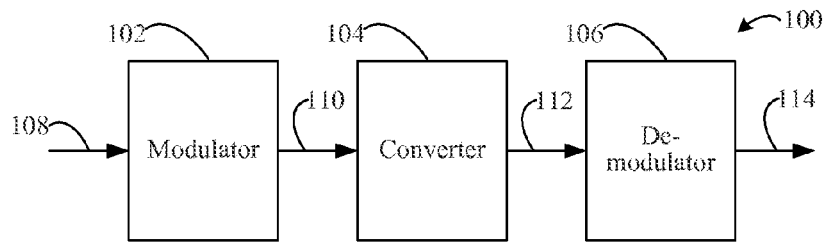
FIG. 1 shows a block diagram of a circuit for performing spread spectrum ADC noise reduction, according to example embodiments.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Still further, it should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner.

II. Example Embodiments

The example techniques and embodiments described herein may be adapted to various types of communication devices, communications systems, computing systems, electronic devices, and/or the like, for spread spectrum analog-to-digital (A/D) converter (ADC) noise reduction. For example, the spread spectrum ADC noise reduction techniques described herein may be implemented in, and/or performed by, devices and systems according to the techniques and embodiments herein. For example, and without limitation, cable modems, cable set-top boxes, satellite set-top boxes, satellite ODU (outdoor unit), terrestrial TVs (televisions), technologies for Multimedia over Coax Alliance (MoCA), uWave, and Wi-Fi, cellular handsets, cellular base stations, universal radio frequency (RF) technologies, 10 Gb Ethernet, products and services in markets that employ Full-Band Capture (FBC) technologies, etc., may employ the described spread spectrum ADC noise reduction techniques in embodiments. Furthermore, additional structural and operational embodiments, including modifications and/or alterations, will become apparent to persons skilled in the relevant art(s) from the teachings herein.

The inventive techniques provide for novel ADC circuits that allow the flattening or spreading of noise spectral density (e.g., concentrated noise in a given spectrum) in Nyquist ADCs and interleaved ADCs (including interleaved Nyquist ADCs) without sacrificing the conversion speed, unduly increasing circuit area, and increasing power consumption. In embodiments, the techniques herein provide for the flattening or spreading of noise spectral density for "1/f" noise (i.e., low-frequency noise). For example, and without limitation, low-frequency noise spectra may range from 100 kHz-1 MHz, or from 1 MHz-10 MHz, in interleaved ADC systems. The techniques and embodiments described herein contemplate application for any band-limited noise at any frequency, such as noise that is more problematic for a specific frequency range compared to an overall signal-to-noise ratio (SNR), e.g., noise that can block channels. Furthermore, the embodiments herein may convert colored noise to white noise in their performance.

In embodiments, an ADC core may have a differential input for receiving a positive signal portion and a negative signal portion of a differential analog input signal. The noise spectral density of an input analog signal may be flattened or dispersed by modulating the analog input signal in the analog domain before performing the A/D conversion, and then demodulating the digital output signal in the digital domain subsequent to the A/D conversion according to embodiments. The modulation technique described herein may modulate and demodulate the appropriate signals according to a binary pseudo-noise (PN) sequence. For example, an analog modulator may switch positive and negative portions of differential analog signals between the differential ADC core inputs. The binary PN sequence may control the analog modulator causing the analog modulator to switch the ADC core positive and negative input terminals according to the PN sequence or a 'pn' value associated therewith, as described herein (e.g., when the PN sequence is a '−1', the terminals may be switched/swapped, and when the PN sequence is a '1', the terminals may be used un-switched). The input analog signal is modulated according to the PN sequence by the analog modulator before being provided to the ADC core inputs. The ADC core output data may be digitally demodulated according to the same PN sequence or pn value used to modulate the analog input signal in order to recover the digitized signal.

The digitized noise is modulated according to the PN sequence, and the noise spectrum is thus spread or flattened according to the PN sequence, thereby reducing its spectral density. If a DC offset is present on the signals, a digital DC offset canceller may also be applied on the ADC core output data before the demodulation. The DC offset may be estimated, e.g., by a long average of the ADC output data. Removing the DC offset prior to demodulation prevents an ADC noise increase due to a large DC offset, and removal in the digital domain increases efficiency and robustness of the described embodiments.

An interleaved ADC implementation with a number ('N') of ADC lanes may implement the above techniques to reduce noise spectral density, according to embodiments. By converting noise to wide-band noise in each of the N lanes, noise up-conversion around the multiples of the combined lane frequency Fs/N is significantly reduced or eliminated (where N is the interleaving factor). The PN sequences generated in the N lanes may be generated by N different PN generators or by a single PN generator and then de-multiplexed to the N lanes.

In embodiments, systems and devices, including circuits, may be configured in various ways to perform spread spectrum ADC noise reduction. For example, FIG. 1 shows a block diagram of an example circuit 100 for performing spread spectrum ADC noise reduction. Circuit 100 includes a modulator 102, a converter 104, and a demodulator 106. As shown, modulator 102 receives an input signal on connection 108, and provides a modulated output signal to converter 104 on connection 110. Converter 104 provides an output signal to demodulator 106 on connection 112, and demodulator 106 provides its output signal on connection 114.

Modulator 102 is configured to receive and modulate the input signal received on connection 108. In embodiments, modulator 102 may operate in the analog domain and receive an analog input. The analog input may be a differential signal input. Modulation of the input signal may be performed according to embodiments described herein, such as but without limitation, according to a pseudo-noise (PN) sequence.

Converter 104 is configured to receive and convert the modulated output signal from modulator 102 on connection 110. In embodiments, converter 104 may convert a received, modulated analog signal into a digital signal representation of the modulated analog signal. In embodiments, converter 104 may be an ADC core or a comparator, or the like.

Demodulator 106 is configured to receive and demodulate the output digital signal (e.g., the digital representation of the modulated analog signal) from converter 104 on connection 112. Demodulator 106 may operate in the digital domain, according to embodiments. Modulation of the input signal may be performed according to embodiments described herein, such as but without limitation, according to the PN sequence that was used to modulate the input signal received by modulator 102 on connection 108. The demodulated, digital output of demodulator 106 on connection 114 provides a noise-spread signal (i.e., a noise reduced signal having lower spectral noise density).

In embodiments, connections 108, 110, 112, and 114 may be connections comprising differential pair connectors, and may be any suitable material or medium for electrical and/or communicative coupling of circuit components, as would be understood by one of skill in the relevant art(s) having the benefit of this disclosure. As described in this disclosure with respect to connections between components of the described embodiments, the terms "coupled to" and "connected to" are intended to indicate an operative, electrical, or communicative connection between such components.

The noise-spread signal, or noise reduced signal having lower spectral noise density, is generated, according to embodiments, by modulating noise present on the input analog signal according to a PN sequence to spread the noise into a wide-band noise representation with low spectral density and then demodulating the resulting digital signal representation using the same PN sequence.

The techniques and embodiments described herein provide for improvements in spread spectrum ADC noise reduction as described above.

For instance, methods, systems, and apparatuses are provided for spread spectrum ADC noise reduction. In an example aspect, an analog-to-digital conversion circuit is disclosed. The analog-to-digital conversion circuit includes an analog modulator, an analog-to-digital (ADC) core, and a digital demodulator. The analog modulator is configured to receive and modulate an input analog signal according to a pseudo-noise (PN) sequence. The ADC core includes a first analog input, a second analog input, and a digital output. The ADC core is configured to differentially receive the modulated input analog signal on the first and second analog inputs, and to convert the modulated input analog signal to a digital signal generated on the digital output. The digital demodulator is configured to receive and demodulate the digital signal according to the PN sequence to generate a noise-spread signal.

In another example aspect, an interleaved analog-to-digital conversion circuit is disclosed. The interleaved analog-to-digital conversion circuit includes a plurality of interleaved data lanes that each include an analog-to-digital conversion circuit. Each analog-to-digital conversion circuit includes an analog modulator, an analog-to-digital converter (ADC) core, and a digital demodulator. Each analog modulator is configured to modulate an input analog signal according to a respective pseudo-noise (PN) sequence. Each ADC core includes a first analog input, a second analog input, and a digital output. Each ADC core is configured to differentially receive the modulated input analog signal on the first and second analog inputs, and to convert the modulated input analog signal to a digital signal generated on the digital output. Each digital demodulator is configured to receive and demodulate the digital signal according to the respective PN sequence to generate a noise-spread signal.

In yet another example aspect, a successive approximation analog-to-digital conversion circuit is disclosed. The successive approximation analog-to-digital conversion circuit includes digital-to-analog converter (DAC), an analog modulator, a comparator, successive approximation register (SAR) logic, and a digital demodulator. The DAC is configured to receive an analog input signal and a successive approximation feedback digital signal, to convert the successive approximation feedback digital signal to a successive approximation feedback analog signal, and to subtract the successive approximation feedback analog signal from the analog input signal to generate an analog signal. The analog modulator is configured to receive and modulate the analog signal according to a pseudo-noise (PN) sequence. The comparator includes a first comparator input, a second comparator input, and a digital comparator output. The comparator is configured to differentially receive the modulated analog signal on the first and second comparator inputs, and to convert the modulated analog signal to a first digital signal generated on the digital comparator output. The SAR logic is configured to receive the first digital signal, generate the successive approximation feedback digital signal, and generate a second digital signal based on successive approximation. The digital demodulator is configured to receive and demodulate the second digital signal according to the PN sequence to generate a noise-spread signal.

It is contemplated that different embodiments described herein may be implemented together in various combinations, as would be apparent to one of skill in the art having the benefit of this disclosure. That is, embodiments described herein are not mutually exclusive of each other and may be practiced alone, or in any combination.

Various example embodiments are described in the following subsections. In particular, example analog-to-digital conversion circuit embodiments are described, followed by example interleaved analog-to-digital conversion circuit embodiments. An example successive approximation register (SAR) analog-to-digital conversion circuit is also provided, and subsequently an example computer implementation is described. Next, further example embodiments and advantages are provided. Finally, some concluding remarks are provided. It is noted that the division of the following description generally into subsections is provided for ease of illustration, and it is to be understood that any type of embodiment may be described in any subsection.

III. Example ADC Circuit Embodiments

As noted above, systems and devices, such as circuits, may be configured in various ways to perform spread spectrum analog-to-digital converter (ADC) noise reduction. Techniques and embodiments are provided for implementation in devices and systems that perform analog-to-digital conversions. For instance, in embodiments, an analog-to-digital conversion circuit may include an analog modulator and a digital demodulator configured to modulate and demodulate signals converted by the ADC according to a pseudo-noise (PN) sequence to generate a noise-spread signal.

Figure 2:
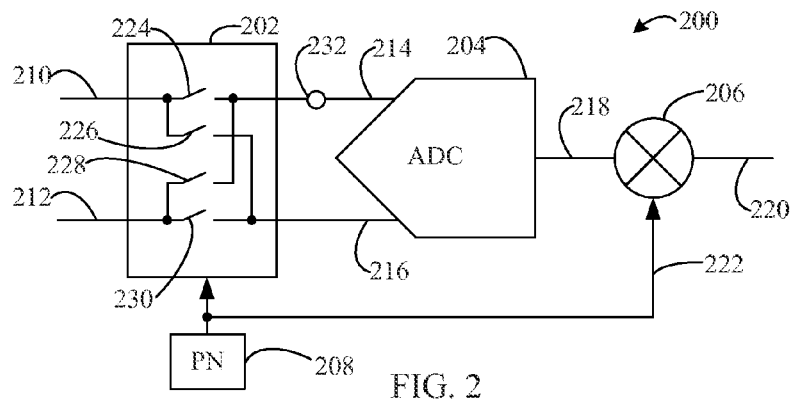
FIG. 2 shows a block diagram of an analog-to-digital conversion circuit, according to example embodiments.

FIG. 2 shows a block diagram of an example analog-to-digital conversion circuit 200 for implementing the above-referenced improvements. Analog-to-digital conversion circuit 200 may include an analog modulator 202, an analog-to-digital converter (ADC) core 204, and a digital demodulator 206, according to embodiments. As shown, analog-to-digital conversion circuit 200 may also include a PN sequence generator (PN generator) 208. Analog-to-digital conversion circuit 200, as illustrated, processes a differential, input analog signal. Analog-to-digital conversion circuit 200 may be a further embodiment of circuit 100 of FIG. 1.

Analog-to-digital conversion circuit 200 includes a differential analog input connection to analog modulator 202 that comprises a first modulator input 210 corresponding to a positive portion of the differential input signal, and that comprises a second modulator input 212 corresponding to a negative portion of the differential input signal. It is contemplated that variations of embodiments of analog-to-digital conversion circuit 200 may be configured such that first modulator input 210 corresponds to the negative portion of the differential input signal and that second modulator input 212 corresponds to the positive portion of the differential input signal (note the embodiment shown in FIG. 2 is for illustration and is not limiting). Analog modulator 202 is coupled to ADC core 204 by a differential connection that comprises a first ADC core input 214 and a second ADC core input 216. In embodiments, first ADC core input 214 and second ADC core input 216 may receive the positive portion of the modulated differential input signal in some operating configurations of analog modulator 202, and may receive negative portion of the modulated differential input signal in other operating configurations of analog modulator 202 described in further detail below. Digital demodulator 206 is coupled to a digital output 218 of ADC core 204, and provides (generates) a noise-spread digital signal on digital demodulator output 220. PN generator 208 is coupled to analog modulator 202 and to digital demodulator 206 by a connection 222 to provide a PN sequence and/or pn value to both analog modulator 202 and digital demodulator 206.

As shown for illustrative conceptualization, the input analog signal of analog-to-digital conversion circuit 200 may include a noise component 232. While illustrated as being on first ADC core input 214, it will be understood by those of skill in the relevant art(s) having the benefit of this disclosure that noise component 232 may also, or alternatively, reside in second ADC core input 216 or on any or all portions of an input analog signal, and that the illustrated embodiment is not limiting, but is for descriptive purposes only.

Analog modulator 202 is configured to receive and modulate the input analog signal received on first modulator input 210 and second modulator input 212. As noted above, the received input analog signal may be a differential signal. In embodiments, analog modulator 202 may be configured to modulate the input analog signal according to a PN sequence generated by PN generator 208. The PN sequence may be a signal that alternates between values (e.g., a binary sequence) to drive one or more configurations of analog modulator 202. Analog modulator 202 may be configured in any manner to perform modulation, including being configured as a set of switches (as shown in FIG. 2), a mixer, or in any other suitable modulator configuration.

For instance, analog modulator may comprise one or more switches such as a first switch 224, a second switch 226, a third switch 228, and a fourth switch 230, as shown. First switch 224 and second switch 226 may be coupled to first modulator input 210, and third switch 228 and fourth switch 230 may be coupled to second modulator input 212. The one or more switches may be placed in one or more configurations according to the PN sequence, as described in further detail below. In embodiments, first switch 224 and fourth switch 230 may activate or close according to a first value of the PN sequence, while second switch 226 and third switch 228 remain open. According to a second value of the PN sequence, first switch 224 and fourth switch 230 may remain open, while second switch 226 and third switch 228 activate or close. In this manner, analog modulator 202 may switch the differential signal portions of an input analog signal received on first modulator input 210 and second modulator input 212 to either of first ADC core input 214 or second ADC core input 216, and the differential input analog signal is thus modulated according to the PN sequence.

ADC core 204 is configured to convert an analog signal to a digital representation of the analog signal. In embodiments, as shown in FIG. 2, ADC core 204 is configured to convert the modulated, differential input analog signal received on first ADC core input 214 and second ADC core input 216 to a modulated digital signal representation of the analog signal on digital output 218. ADC core 204 may be any ADC circuit capable of performing an analog-to-digital conversion, e.g., of a differential input analog signal, as will become apparent to one of skill in the relevant art(s) having the benefit of this disclosure.

Digital demodulator 206 is configured to receive and demodulate the modulated digital signal on digital output 218 of ADC core 204. In embodiments, digital demodulator 206 may be configured to demodulate the digital signal according to the PN sequence generated by PN generator 208 that was used to modulate the input analog signal by analog modulator 202. By demodulating the digital signal using the same PN sequence that was used to modulate the signal, the original signal values may thus be obtained in the digital domain while generating a noise-spread signal with reduced spectral noise density. Digital demodulator 206 may be configured in any manner to perform demodulation, including being configured as a mixer (as shown in FIG. 2), or in any other suitable demodulator configuration.

PN generator 208 is configured to generate a pseudo-noise (PN) sequence. The generated PN sequence may be used to modulate and/or demodulate signals according to the embodiments herein. For example, analog modulator 202 and/or digital demodulator 206 may use the generated PN sequence for modulation and demodulation of signals, respectively. In embodiments, a derivation or representation of the PN sequence may be used by analog modulator 202 and/or digital demodulator 206 for respective modulation and demodulation of signals as described in further detail below. PN generator 208 may be configured in any suitable manner to generate a PN sequence, including in the form of an oscillator having an output filtered by logic that modulates the output with a PN sequence, or in a different PN sequence generator configuration that may be known to persons skilled in the relevant art(s).

Figure 3:
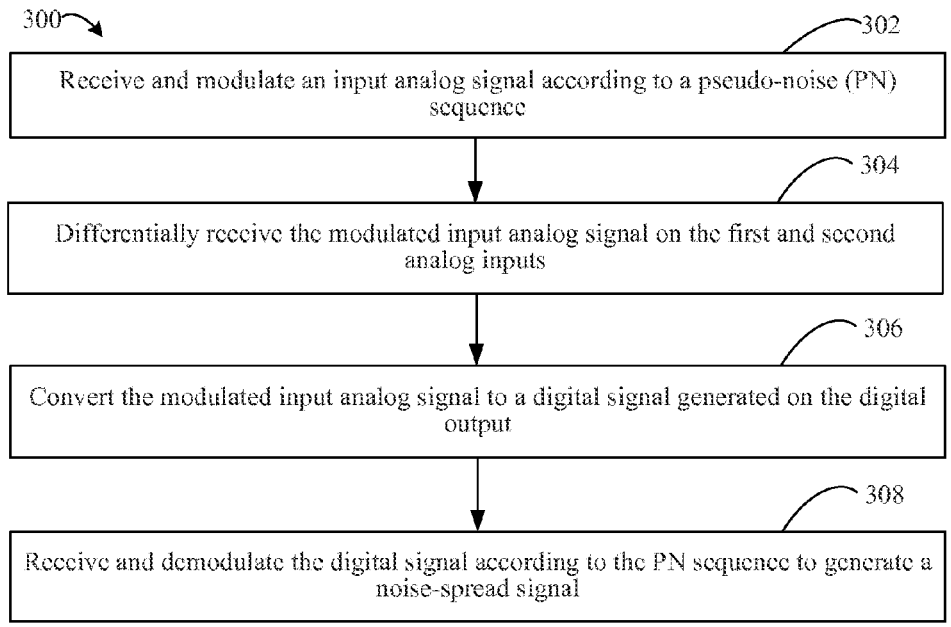
FIG. 3 shows a flowchart providing a process for performing spread spectrum ADC noise reduction, according to an example embodiment.

Turning now to FIG. 3, a flowchart 300 according to which example embodiments herein are configured to perform is shown. For instance, analog-to-digital conversion circuit 200 of FIG. 2, along with any subcomponents thereof, may be configured to perform spread spectrum ADC noise reduction according to flowchart 300. Flowchart 300 is described as follows.

In flowchart 300, an input analog signal is received and modulated according to a pseudo-noise (PN) sequence (302). In embodiments, the input analog signal is received and modulated by analog modulator 202 according to the pseudo-noise (PN) sequence as described with respect to FIG. 2. Analog modulator 202 may be configured to modulate the input analog signal by alternating provision of portions of the input analog signal between the first and second inputs of ADC core 204, as also described with respect to FIG. 2, and as described in further detail herein.

The modulated input analog signal is differentially received on the first and second analog inputs (304). For example, the modulated input analog signal may be differentially received on the first and second analog inputs of ADC core 204 of FIG. 2. As described herein, different portions of the input analog signal may be received by the first and second analog inputs of ADC core 204 according to configurations of analog modulator 202 that are driven according to the PN sequence.

The modulated input analog signal is converted to a digital signal generated on the digital output (306). For instance, the modulated input analog signal may be converted by ADC core 204 of FIG. 2 to a digital signal generated on digital output 218 of ADC core 204. The generated digital signal may be a digital representation of the modulated input analog signal.

The digital signal is received and demodulated according to the PN sequence to generate a noise-spread signal (308). In embodiments, the digital signal may be received and demodulated according to the PN sequence by digital demodulator 206 (as shown in FIG. 2) to generate to noise-spread signal as an output of digital demodulator 206. The noise-spread signal may thus be a recaptured representation of the input analog signal in the digital domain having a reduced noise spectral density.

In some example embodiments, one or more of 302, 304, 306, and/or 308 of flowchart 300 may not be performed. Moreover, capabilities in addition to or in lieu of 302, 304, 306, and/or 308 may be performed. Further, in some example embodiments, one or more of the capabilities in 302, 304, 306, and/or 308 may be performed out of order, in an alternate sequence, or partially (or completely) concurrently with each other or with other capabilities.

Figure 4:
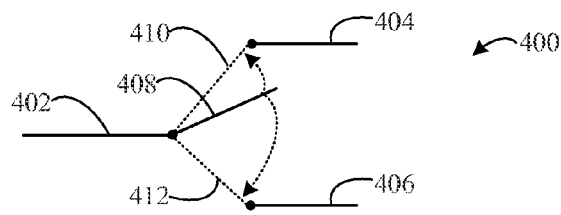
FIG. 4 shows a block diagram of an example switch configuration, according to an embodiment.

As noted herein, embodiments may be configured in various ways to perform their respective functions according to the inventive techniques described herein. Turning now to FIG. 4, a diagram of an example switch 400 is shown. In the example of FIG. 4, switch 400 is a single pole, double throw (SPDT) switch. In embodiments, one or more of switch 400 may be used in place of one or more of first switch 224, second switch 226, third switch 228, and fourth switch 230 (which are single pole, single throw (SPST) switches) of analog modulator 202 of FIG. 2. For instance, a first one of switch 400 may be used instead of first switch 224 and second switch 226 of analog modulator 202, and a second one of switch 400 may be used instead of third switch 228 and fourth switch 230 of analog modulator 202, in embodiments.

As illustrated in FIG. 4, switch 400 includes a switch input 402 and a switching member 408 configured to be coupled to a first switch output 404 in a first switch configuration 410, and configured to be coupled to a second switch output 406 in a second switch configuration 412. In embodiments, as described herein, switch 400 may operate in first switch configuration 410 according to a first PN sequence value, and may operate in second switch configuration 412 according to a second PN sequence value. With respect to analog modulator 202 of FIG. 2, switch input 402 may be coupled to first modulator input 210 or to second modulator input 212, and first switch output 404 and second switch output 406 may be connected to first ADC core input 214 and to second ADC core input 216, according to the embodiment shown in FIG. 2.

While switch 400 is shown as an alternative embodiment with respect to switching components of analog modulator 202, it is contemplated that other types of switches and components that perform equivalent switching operations may be used in embodiments described herein. For example, and without limitation, multiplexors/de-multiplexors, combinatorial logic, other switches, transistors (e.g., field effect transistors (FETs) such as nFET, pFET, etc.), and or the like may be used.

Figure 5:
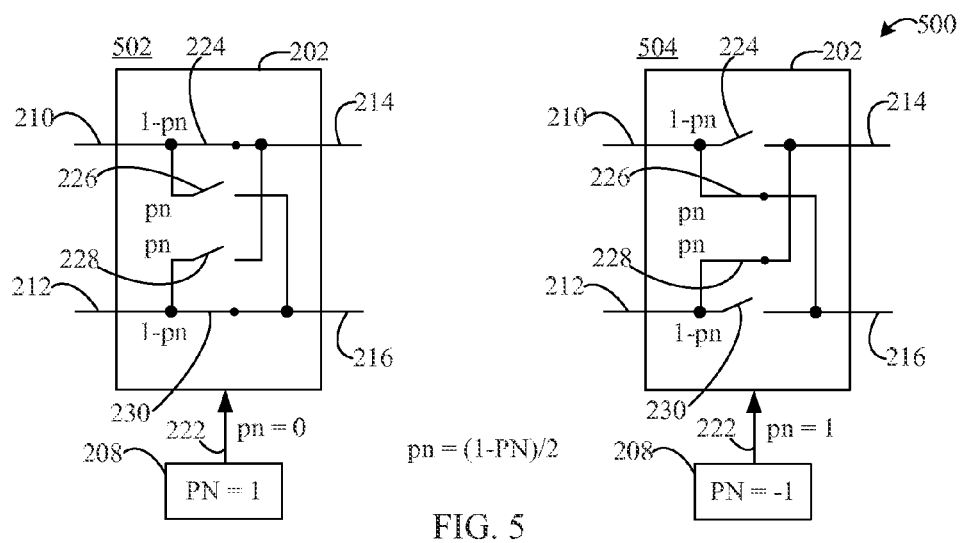
FIG. 5 shows a block diagram of first and second analog modulator configurations, according to an example embodiment.

Referring now to FIG. 5, an example block diagram of analog modulator configurations 500 is shown. Analog modulator configurations 500 will be described with respect to analog modulator 202 and PN generator 208, including one or more of their associated connections as described in FIG. 2, for ease of illustration. As described herein, an analog modulator such as analog modulator 202, may operate in one or more configurations according to a PN sequence to modulate an input analog signal. The PN sequence may be a PN sequence generated by PN generator 208 and provided to (i.e., received by) analog modulator 202, as described with respect to FIG. 2. In embodiments, modulating and demodulating according to a PN sequence, as described herein, may include modulating and/or demodulating using the PN sequence directly, or modulating and/or demodulating using a value ('pn') associated with the generated PN sequence. As used herein, a PN sequence that is received refers to either the PN sequence itself or the pn value associated therewith.

Figure 6:
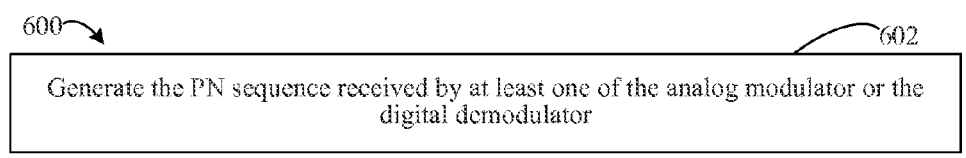
FIG. 6 shows a process for performing spread spectrum ADC noise reduction, according to an example embodiment.

Turning to FIG. 6, a process 600 according to which example embodiments herein may be configured to perform is shown. For instance, analog-to-digital conversion circuit 200 of FIG. 2, along with any subcomponents thereof such as PN generator 208, may be configured to operate according to process 600. Process 600 may be combined with one or more portions of other flowcharts described herein, according to embodiments. Process 600 is described as follows.

At 602, the PN sequence received by at least one of the analog modulator or the digital demodulator is generated. The PN sequenced may be generated by PN generator 208 of FIG. 2, and may be received by at least one of analog modulator 202 or digital demodulator 206 and may be used to control modulation and demodulation as described herein. The PN sequence may be an alternating binary PN sequence such as a square wave. PN generator 208 may also generate a pn value associated with the PN sequence where the pn value may be used to control modulation and demodulation as described herein. For example, in embodiments, a pn value may be generated according to Equation 1 as follows:

$$pn = \frac{(1 - PN)}{2}. \quad \text{(Eq. 1)}$$

Figure 7:
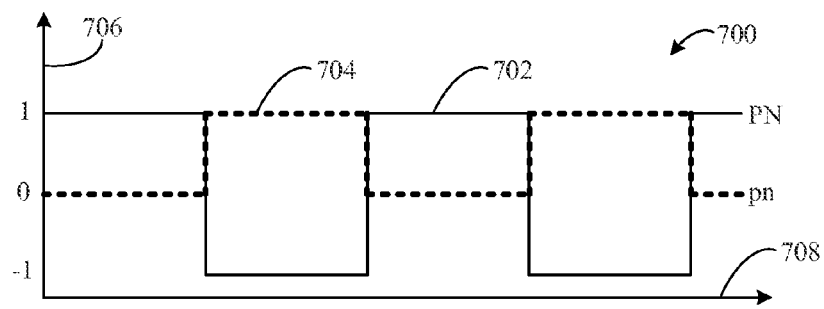
FIG. 7 shows a signal diagram of an alternating binary PN (pseudo noise) sequence and a corresponding 'pn' value, according to an example embodiment.

FIG. 7 shows an example signal diagram 700 of an alternating binary PN sequence and a corresponding pn value that may be generated by PN generator 208, according to embodiments. Signal diagram 700 includes a vertical axis 706 showing relative amplitude values and a horizontal axis 708 showing time. As illustrated, a PN sequence 702 (solid line) may be a square wave having alternating values of '1' and '−1'. A pn value 704 (dashed line) associated with PN sequence 702 is also illustrated. As shown, pn value 704 may be generated by PN generator having a value according to Equation 1 above That is, when PN sequence 702 is '1', pn value 704 is '0', and when PN sequence 702 is '−1', pn value 704 is '1'.

It should be noted that the alternating binary values of PN sequence 702 in FIG. 7 (i.e., '1' and '−1') are exemplary, non-limiting values and are used for illustrative purposes. Other values representing an alternating binary PN sequence are also contemplated herein. Additionally, other associations of pn value 704 with respect to PN sequence 702, according to functions not shown, are contemplated. For instance, for a given PN sequence, a formulaic association may be derived such that resulting pn values include values required to control one or more switching components of an analog modulator such as analog modulator 202 (e.g., transistors with active-low or active-high gates, active-low or active-high switches, etc.). It should also be noted that FIG. 7 is not drawn to scale, and further that frequencies, duty cycles, and amplitudes other than as shown in FIG. 7 are also contemplated herein. In embodiments, amplitudes associated with vertical axis 706 may be voltages, logical values (e.g., high/low), and/or the like, and any unit of time may be used for horizontal axis 708.

Referring back to FIG. 5, analog modulator configurations 500 illustrate a first configuration 502 in which the current PN sequence is '1' and has an associated pn value of '0', and a second configuration 504 in which the current PN sequence is '−1' and has an associated pn value of '1'. A PN sequence and/or a pn value may be received by analog modulator 202 on connection 222 from PN generator 208.

As described herein, one or more switches or switching components of analog modulator may be placed in one or more configurations according to the PN sequence. For example, first switch 224 and fourth switch 230 may activate or close when '1−pn=1' is true, and second switch 226 and third switch 228 may activate or close when 'pn=1' is true. As shown in first configuration 502, first switch 224 and fourth switch 230 are activated or closed according to a first value of the PN sequence (i.e., PN=1; pn=0), while second switch 226 and third switch 228 remain open. As shown in second configuration 504, according to a second value of the PN sequence (i.e., PN=−1; pn=1), first switch 224 and fourth switch 230 may remain open, while second switch 226 and third switch 228 are activated or closed. In this manner, analog modulator 202 may switch the differential signal portions of an input analog signal received on first modulator input 210 and second modulator input 212 to either of first ADC core input 214 or second ADC core input 216, and the differential input analog signal is thus modulated according to the PN sequence.

The ADC noise reduction described with respect to the preceding figures may be carried out according to Equation 1 above and according to the following equations, where PN[n] is the PN sequence, where S[n] is the input analog signal, where N[n] is noise present in S[n], where D[n] is the digital output signal of ADC core 204 on digital output 218, and where Do[n] is the noise-spread digital signal output of digital demodulator 206 on digital demodulator output 220:

$$D[n]=S[n] \cdot PN[n]+N[n];$$ (Eq. 2)

$$Do[n]=D[n] \cdot PN[n]=S[n] \cdot PN[n]^2+N[n] \cdot PN[n];$$ (Eq. 3)

$$Do[n]=S[n]+N[n] \cdot PN[n].$$ (Eq. 4)

Figure 8:
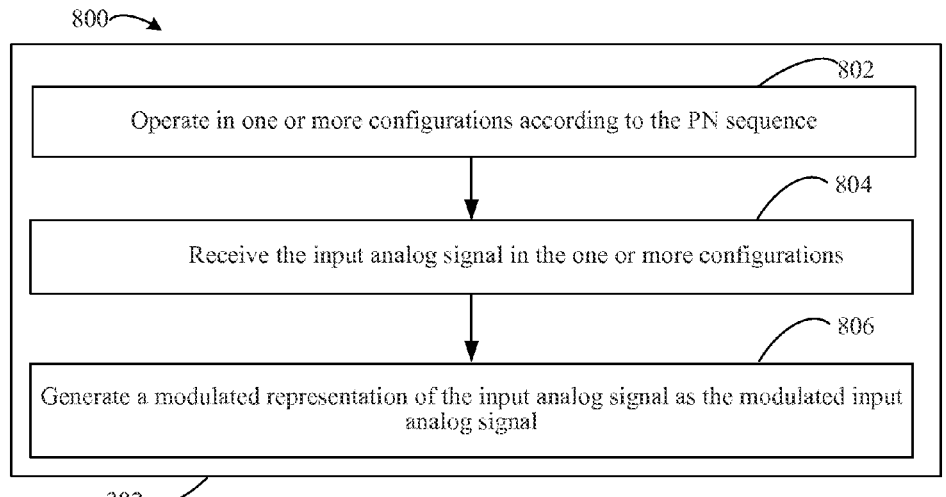
FIG. 8 shows a flowchart providing a process for performing spread spectrum ADC noise reduction, according to an example embodiment.

Turning now to FIG. 8, a flowchart 800 according to which example embodiments herein may be configured to perform is shown. For instance, analog-to-digital conversion circuit 200 of FIG. 2, along with any subcomponents thereof such as analog modulator 202, may be configured to perform spread spectrum ADC noise reduction according to flowchart 800. Flowchart 800 may be a further embodiment of 302 in flowchart 300 of FIG. 3 described above. Flowchart 800 is described as follows.

In flowchart 800, one or more configurations are operated in according to the PN sequence (802). In embodiments, analog modulator 202 is configured to operate in one or more configurations according to the pseudo-noise (PN) sequence generated by PN generator 208, as described herein. Analog modulator 202 may be configured to modulate an input analog signal by alternating which portions of the input analog signal are received by the first and second inputs of ADC core 204, e.g., as described with respect to one or more of FIGS. 2-7 above. For example, one or more switching components of analog modulator 202 may be configured to operate in different positions according to the PN sequence generated by PN generator 208. In embodiments, as shown in and described with respect to FIG. 5, in first configuration 502, first switch 224 and fourth switch 230 are activated or closed, while second switch 226 and third switch 228 remain open. As shown in second configuration 504, first switch 224 and fourth switch 230 may remain open, while second switch 226 and third switch 228 are activated or closed.

The input analog signal is received in the one or more configurations (804). For example, the input analog signal may be received by analog modulator 202 in one or more of the configurations of 802. In embodiments, the input analog signal may be received while analog modulator 202 is in a first configuration, such as first configuration 502, where a positive portion of a received differential analog signal is to be provided to first ADC core input 214 of ADC core 204 (i.e., a positive ADC core input), and where a negative portion of the received differential analog signal is to be provided to second ADC core input 216 of ADC core 204 (i.e., a negative ADC core input). The input analog signal may be received while analog modulator 202 is in a second configuration, such as second configuration 504, where a negative portion of a received differential analog signal is to be provided to first ADC core input 214 of ADC core 204 (i.e., a positive ADC core input), and where a positive portion of the received differential analog signal is to be provided to second ADC core input 216 of ADC core 204 (i.e., a negative ADC core input). As described herein, the configuration of analog modulator 202 may be controlled according to the PN sequence generated by PN generator 208.

A modulated representation of the input analog signal is generated as the modulated input analog signal (806). For instance, analog modulator 202 may alternate between the configurations described herein according to a PN sequence and may thus generate the modulated input analog signal by alternating positive and negative portions of received differential analog signals between ADC core inputs. In embodiments, a positive portion of a received differential analog signal is provided to first ADC core input 214, and a negative portion of the received differential analog signal is provided to second ADC core input 216, then a negative portion of the received differential analog signal is provided to first ADC core input 214, and a positive portion of the received differential analog signal is provided to second ADC core input 216 according to the PN sequence. As the portions of the received differential analog signals are alternatingly provided between the ADC core inputs, the modulated input analog signal is generated.

In some example embodiments, one or more of 802, 804, and/or 806 of flowchart 800 may not be performed. Moreover, capabilities in addition to or in lieu of 802, 804, and/or 806 may be performed. Further, in some example embodiments, one or more of the capabilities in 802, 804, and/or 806 may be performed out of order, in an alternate sequence, or partially (or completely) concurrently with each other or with other capabilities.

Figure 9:
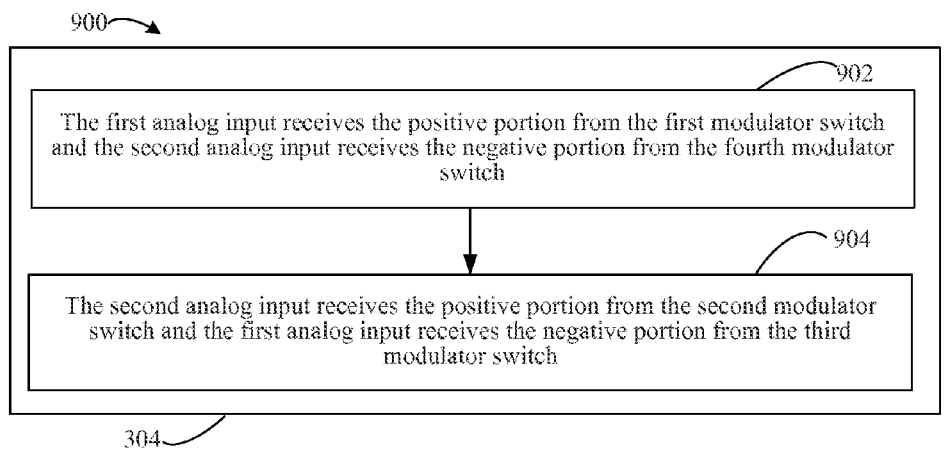
FIG. 9 shows a flowchart providing a process for performing spread spectrum ADC noise reduction, according to an example embodiment.

FIG. 9 shows a flowchart 900 according to which example embodiments herein may be configured to perform. For instance, analog-to-digital conversion circuit 200 of FIG. 2, along with any subcomponents thereof such as ADC core 204, may be configured to perform spread spectrum ADC noise reduction according to flowchart 900. Flowchart 900 may be a further embodiment of 304 in flowchart 300 of FIG. 3 described above. Flowchart 900 is described as follows.

In flowchart 900, the first analog input receives the positive portion from the first modulator switch and the second analog input receives the negative portion from the fourth modulator switch (902). In embodiments, ADC core 204 is configured to differentially receive a positive portion of a modulated input analog signal at first ADC core input 214 and to differentially receive a negative portion of the modulated input analog signal at second ADC core input 216 from analog modulator 202, e.g., when analog modulator 202 is in a first configuration according to a PN sequence. For example, switches or switching elements of analog modulator 202 may be configured to couple first modulator input 210 of analog modulator 202 to first ADC core input 214 and couple second modulator input 212 of analog modulator 202 to second ADC core input 216 in a first configuration.

The second analog input receives the positive portion from the second modulator switch and the first analog input receives the negative portion from the third modulator switch (904). In embodiments, ADC core 204 is configured to differentially receive a positive portion of a modulated input analog signal at second ADC core input 216 and to differentially receive a negative portion of the modulated input analog signal at first ADC core input 214 from analog modulator 202, e.g., when analog modulator 202 is in a second configuration according to a PN sequence. For example, switches or switching elements of analog modulator 202 may be configured to couple first modulator input 210 of analog modulator 202 to second ADC core input 216 and couple second modulator input 212 of analog modulator 202 to first ADC core input 214 in a second configuration.

In some example embodiments, capabilities in addition to or in lieu of 902 and/or 904 may be performed. Further, in some example embodiments, one or more of the capabilities in 902 and/or 904 may be performed in an alternate sequence.

Figure 10:
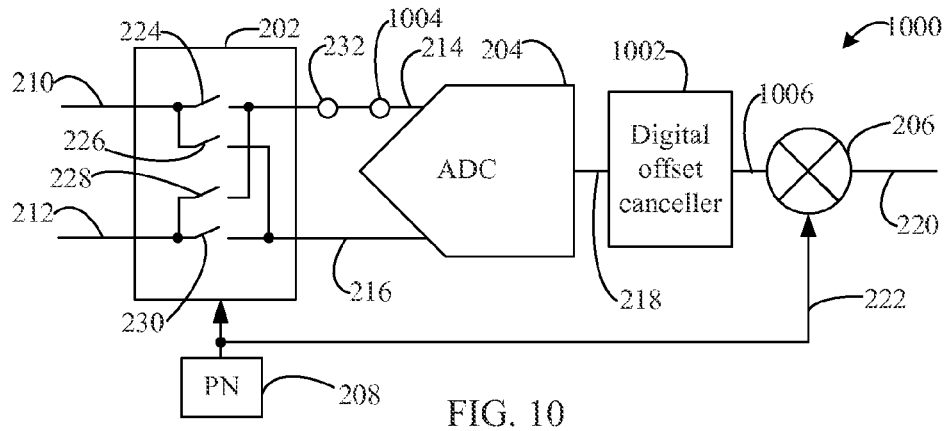
FIG. 10 shows a block diagram of a DC offset analog-to-digital conversion circuit, according to an example embodiment.

The techniques and embodiments described herein for spread spectrum ADC noise reduction may include direct current (DC) offset cancellation. For instance, received input analog signals may include a DC offset, in embodiments. The described techniques and embodiments may be configured to cancel DC offsets on such input analog signals. FIG. 10 shows a block diagram of an example DC offset analog-to-digital conversion circuit 1000. As illustrated, DC offset analog-to-digital conversion circuit 1000 includes the components of analog-to-digital conversion circuit 200 of FIG. 2 described above which may function in a similar or substantially similar manner as described therein.

As shown for illustrative conceptualization, the input analog signal of DC offset analog-to-digital conversion circuit 1000 may include a DC offset 1004. While illustrated as being on first ADC core input 214, it will be understood by those of skill in the relevant art(s) having the benefit of this disclosure that DC offset 1004 may apply to any or all portions of an input analog signal, and that the illustrated embodiment is not limiting, but is for descriptive purposes only.

DC offset analog-to-digital conversion circuit 1000 also includes a digital offset canceller 1002. Digital offset canceller 1002 may reside between ADC core 204 and digital demodulator 206 as shown, according to embodiments. That is, digital offset canceller 1002 may be configured to receive the digital signal output by ADC core 204 on digital output 218, and may be configured to provide a non-offset representation of the digital signal to digital demodulator 206 on a connection 1006. In embodiments, digital offset canceller 1002 is configured to remove DC offset 1004 from the input analog signal. Digital offset canceller 1002 may perform this function in various ways. For instance, digital offset canceller 1002 may be configured to perform this function according to the following equations, where PN[n] is the PN sequence, where S[n] is the input analog signal, where N[n] is noise present in S[n], where D[n] is the digital output signal of ADC core 204 on digital output 218, where Dc[n] is the non-offset digital signal output of digital offset canceller 1002 on connection 1006, and where Do[n] is the noise-spread digital signal output of digital demodulator 206 on digital demodulator output 220:

$$D[n]=S[n]\cdot PN[n]+N[n]+DC; \quad \text{(Eq. 5)}$$

$$Dc[n]=D[n]-DC=S[n]\cdot PN[n]+N[n]; \quad \text{(Eq. 6)}$$

$$Do[n]=D[n]\cdot PN[n]=S[n]\cdot PN[n]^2+N[n]\cdot PN[n]; \quad \text{(Eq. 3)}$$

$$Do[n]=S[n]+N[n]\cdot PN[n]. \quad \text{(Eq. 4)}$$

In the embodiment illustrated in FIG. 10, digital offset canceller 1002 removes DC offset 1004 from the input analog signal before demodulation is performed by digital demodulator 206. By removing DC offset 1004 prior to demodulation, increases in noise due to the DC offset may be prevented.

It is further contemplated that a DC offset such as DC offset 1004 may be estimated by monitoring digital signal output data of the embodiments described herein. In some cases, a long-term average of the digital signal output data may be used to estimate a DC offset.

Figure 11:
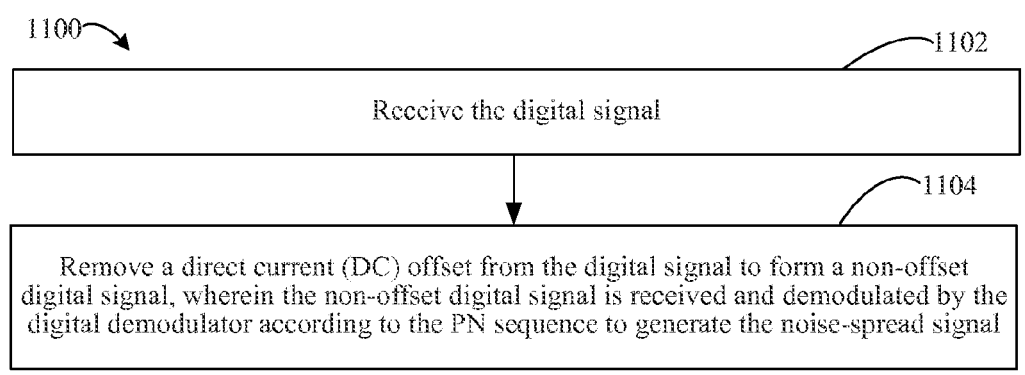
FIG. 11 shows a flowchart providing a process for performing spread spectrum ADC noise reduction, according to an example embodiment.

Turning now to FIG. 11, a flowchart 1100 according to which example embodiments herein may be configured to perform is shown. For instance, DC offset analog-to-digital conversion circuit 1000, along with any subcomponents thereof such as digital offset canceller 1002, may be configured to perform spread spectrum ADC noise reduction techniques, including DC offset cancellation, according to flowchart 1100. Flowchart 1100 may be performed in conjunction with flowchart 300 of FIG. 3 described above in embodiments. Flowchart 1100 is described as follows.

In flowchart 1100, the digital signal is received (1102). In embodiments, digital offset canceller 1002 is configured to receive the digital signal as an output from ADC core 204 on digital output 218. In such embodiments, the digital signal maybe a digital domain representation of a modulated input analog signal as described herein.

A direct current (DC) offset is removed from the digital signal to form a non-offset digital signal, wherein the non-offset digital signal is received and demodulated by the digital demodulator according to the PN sequence to generate the noise-spread signal (1104). For example, digital offset canceller 1002 may be configured to remove the DC offset from the digital signal received in 1102 to generate or form a non-offset digital signal representation of the received digital signal. Digital demodulator 206 may receive the non-offset signal digital from digital offset canceller 1002, and may perform a demodulation of the received non-offset digital signal in accordance with the embodiments described herein (e.g., according to a PN sequence) to generate a noise-spread signal output.

IV. Example Multi-Lane Interleaved ADC Embodiments

As noted above, systems and devices, such as circuits, may be configured in various ways to perform spread spectrum analog-to-digital converter (ADC) noise reduction. Techniques and embodiments are provided for implementation in devices and systems that perform analog-to-digital conversions. For instance, in embodiments, a number of interleaved analog-to-digital conversion circuits may be configured to modulate and demodulate signals according to a pseudo-noise (PN) sequence(s) to generate a noise-spread signals for their respective lanes.

Figure 12:
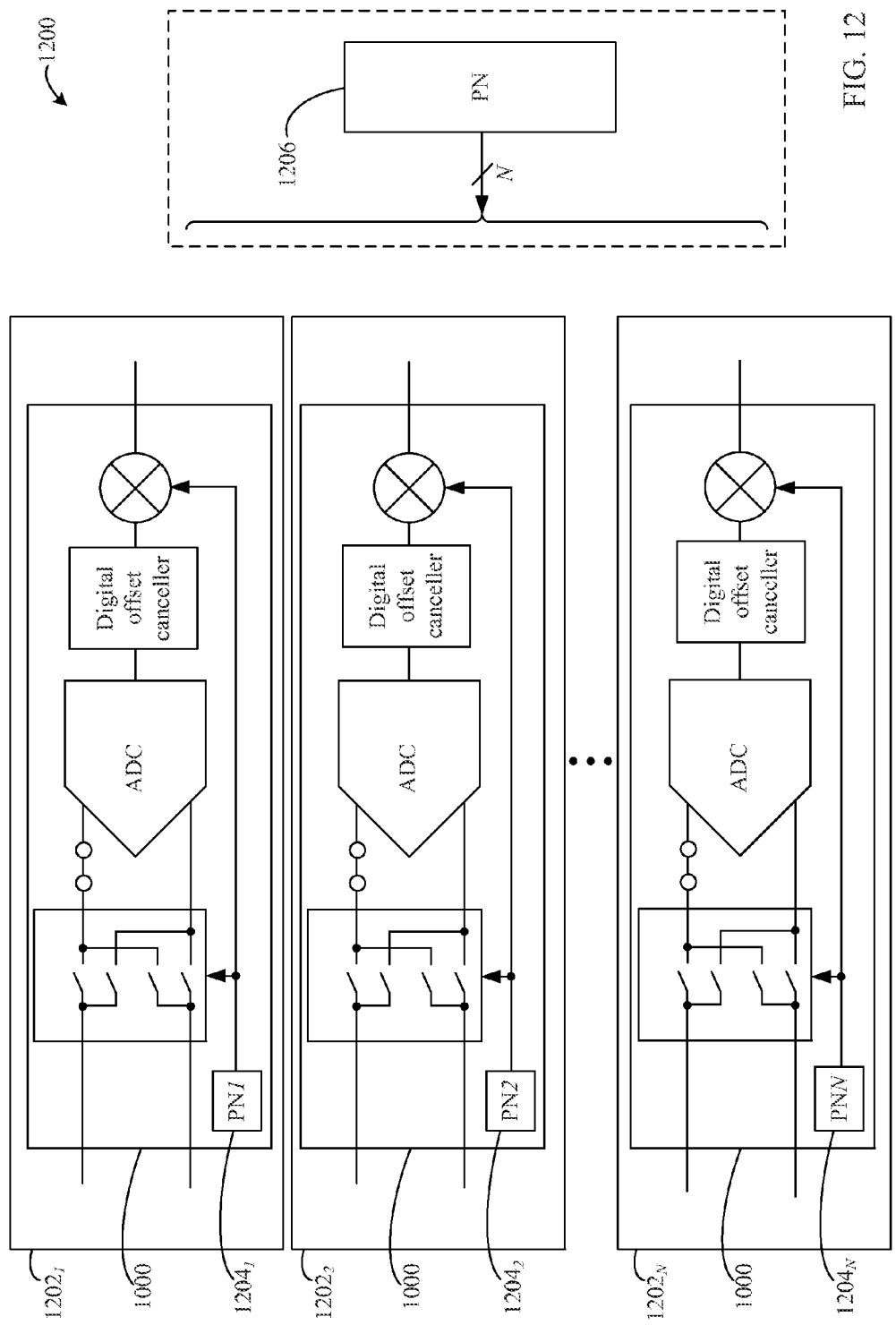
FIG. 12 shows a plurality of interleaved analog-to-digital conversion circuit lanes, according to an example embodiment.

FIG. 12 shows a block diagram of example interleaved analog-to-digital conversion circuit lanes 1200, according to embodiments. Interleaved analog-to-digital conversion circuit lanes 1200 may be implemented in an interleaved ADC circuit, for example. Interleaved analog-to-digital conversion circuit lanes 1200 may include a plurality of lanes $1202_1$-$1202_N$. Any number ('N') of lanes 1202, e.g., two or more, may be included in different embodiments. Each lane of plurality of lanes $1202_1$-$1202_N$ may include an analog-to-digital conversion circuit such as DC offset analog-to-digital conversion circuit 1000 (shown for illustration) or analog-to-digital conversion circuit 200 (not shown), each of which are described in detail above. For illustrative clarity, individual components of DC offset analog-to-digital conversion circuit 1000 are not shown in FIG. 12, but it is contemplated that the configuration and function(s) of DC offset analog-to-digital conversion circuit 1000 may be the same or similar to the above-referenced description with the following alterations.

For example, as shown, each lane of plurality of lanes $1202_1$-$1202_N$ may include respective PN generators 1204 (e.g., PN generator $1204_1$ in lane $1202_1$, PN generator $1204_2$ in lane $1202_2$, PN generator $1204_N$ in lane $1202_N$, etc.). The PN sequences and pn values generated for plurality of lanes $1202_1$-$1202_N$ may be generated by the N different PN generators $1204_{1-N}$. While each of PN generators 1204 may be configured and operable as, or substantially similar to, PN generator 208 described above, in some embodiments, PN generators 1204 may be implemented as a single PN generator 1206 configured to provide a PN sequence and/or pn value to all lanes $1202_1$-$1202_N$. In such embodiments, PN generator 1206 may provide its PN sequence or pn value to all lanes $1202_1$-$1202_N$ concurrently, or in an alternating manner via de-multiplexing or direct connections (not shown), and/or the like, as would be understood by one of skill in the relevant art(s) having the benefit of this disclosure. That is, PN generator 1206 may provide its PN sequence or pn value to all lanes $1202_1$-$1202_N$ according to lane activity as described below.

The lanes of plurality of lanes $1202_1$-$1202_N$ may operate in an interleaved manner. For instance, one lane of plurality of lanes $1202_1$-$1202_N$ may be active and receive data (e.g., an input analog signal) at a given time, while the others are inactive. Plurality of lanes $1202_1$-$1202_N$ may alternate active lanes, in any manner, according to embodiments, although such embodiments are not considered limiting in this disclosure. Alternatively, one or more lanes, including all of lanes $1202_1$-$1202_N$, may be active simultaneously. As such, each lane of plurality of lanes $1202_1$-$1202_N$ may receive an input analog signal and employ the described spread spectrum techniques to reduce its noise spectral density, e.g., l/f noise of each lane. For example, each DC offset analog-to-digital conversion circuit 1000 (or analog-to-digital conversion circuit 200 in embodiments (not shown)) of lanes $1202_1$-$1202_N$ may perform its respective functions as described above, including performance of spread spectrum ADC noise reduction, e.g., according to Equations 1-6, for its respective lane $1202_{1-N}$.

Accordingly, interleaved analog-to-digital conversion circuit lanes 1200 are configured to convert noise, e.g., l/f noise, to wide-band noise in each lane, thereby reducing, or eliminating, noise up-conversion, such as l/f noise up-conversion, around the multiples of Fs/N.

V. Example SAR Circuit Embodiments

Additionally, systems and devices, such as circuits, may be configured in various ways to perform spread spectrum analog-to-digital noise reduction using comparators in successive approximation register (SAR) implementations. For instance, in embodiments, an analog-to-digital conversion circuit may include an analog modulator and a digital demodulator configured to modulate and demodulate signals converted by the comparator according to a pseudo-noise (PN) sequence to generate a noise-spread signal.

Figure 13:
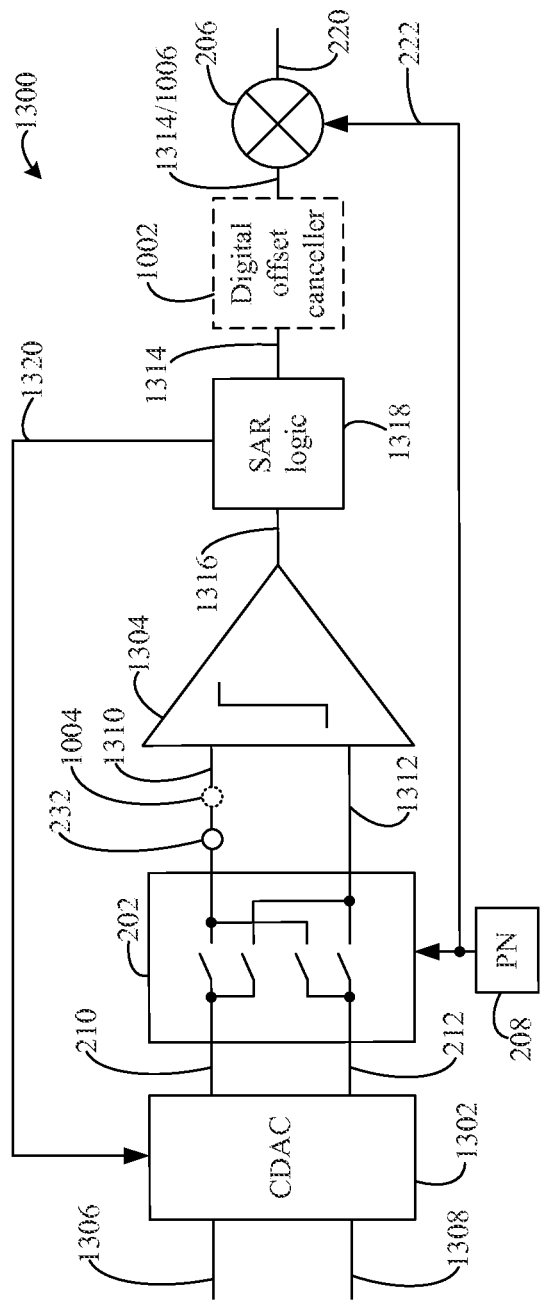
FIG. 13 shows a block diagram of a successive approximation register (SAR) analog-to-digital conversion circuit, according to an example embodiment.

FIG. 13 shows a block diagram of an example SAR analog-to-digital conversion circuit 1300, according to embodiments. SAR analog-to-digital conversion circuit 1300 may be a further embodiment of circuit 100 of FIG. 1, and an alternate embodiment of analog-to-digital conversion circuit 200 of FIG. 2 and/or DC offset analog-to-digital conversion circuit 1000 of FIG. 10. For instance, SAR analog-to-digital conversion circuit 1300 may be structurally and/or operationally similar to analog-to-digital conversion circuit 200 (and/or DC offset analog-to-digital conversion circuit 1000) but having a comparator 1304, SAR logic 1318, and a capacitor digital-to-analog converter (DAC) 1302 (hereinafter "CDAC 1302") rather than ADC core 204 to perform the analog-to-digital conversion. SAR analog-to-digital conversion circuit 1300 may include analog modulator 202 and digital demodulator 206, according to embodiments, as described above with respect to FIG. 2, and as shown, SAR analog-to-digital conversion circuit 1300 may also include PN generator 208. SAR analog-to-digital conversion circuit 1300, as illustrated, contemplates a differential input signal.

CDAC 1302 is configured to receive an analog input signal, such as a differential input signal, on a first CDAC input 1306 and on a second CDAC input 1308, and to receive a digital control signal 1320. In embodiments, first CDAC input 1306 may correspond to a first portion (e.g., plus node) of a differential signal, and second CDAC input 1308 may correspond to a second portion (e.g., minus node) of the differential signal. CDAC 1302 may be configured to receive the analog input signal using a capacitor or capacitor array, in embodiments. CDAC 1302 may be configured to perform a digital-to-analog conversion of digital control signal 1320, and to generate an analog output signal to be provided to analog modulator 202. CDAC 1302 may be any CDAC circuit or component(s) configured to perform a digital-to-analog conversion, such as a switched CDAC that includes a parallel capacitor network in which individual capacitors may be connected or disconnected with switches based on inputs to the CDAC (e.g., from SAR logic 1318 via a CDAC control connection 1320 that provides a successive approximation feedback signal(s) from SAR logic 1318). In embodiments, CDAC 1302 may also include a DAC and a differential subtractor. For instance, a DAC of CDAC 1302 may be configured to convert a digital representation of a signal to an analog version of the signal (e.g., converting a digital representation output from a capacitor array to an analog signal to be provided to a differential subtractor). In embodiments, CDAC 1302 may be configured to subtract, by the differential subtractor, a DAC output signal representing a successive approximation value provided by SAR logic 1318 from an analog input signal to generate an analog output signal (e.g., on first modulator input 210 and on second modulator input 212, respectively) representing the difference between the analog input signal value and the successive approximation value generated by SAR logic 1318 for successive approximation operations. In embodiments, the successive approximation value may be converted from a digital signal representation to an analog signal prior to performing the subtraction. The operation of CDAC 1302, e.g., subtraction and switch operation within CDAC 1302, may be controlled, at least in part, by SAR logic 1318 via CDAC control connection 1320 that provides the successive approximation feedback signal(s) from SAR logic 1318.

SAR analog-to-digital conversion circuit 1300 includes a differential analog input connection to analog modulator 202 that comprises first modulator input 210 corresponding to a positive portion of the differential input signal, and that comprises second modulator input 212 corresponding to a negative portion of the differential input signal. It is contemplated that variations of embodiments of SAR analog-to-digital conversion circuit 1300 may be configured such that first modulator input 210 corresponds to the positive portion of the differential input signal and that second modulator input 212 corresponds to the negative portion of the differential input signal (note the embodiment shown in FIG. 13 is for illustration and is not limiting). First modulator input 210 and second modulator input 212 may be coupled to CDAC 1302 as shown in FIG. 13.

Analog modulator 202 is coupled to comparator 1304 by a differential connection that comprises a first comparator input 1310 and a second comparator input 1312. In embodiments, first comparator input 1310 and second comparator input 1312 may receive the positive portion of the modulated differential analog signal in some operating configurations of analog modulator 202, and may receive the negative portion of the modulated differential analog signal in other operating configurations of analog modulator 202, as described in further herein. Digital demodulator 206 is coupled to a SAR output 1314 of SAR logic 1318, in embodiments, or may alternatively be coupled to SAR output 1314 of SAR logic 1318 via digital offset canceller 1002 and connection 1006 in alternate embodiments for which DC offset 1004 is present as described with respect to FIG. 10. Digital demodulator 206 generates and provides a noise-spread digital signal on digital demodulator output 220. PN generator 208 is coupled to analog modulator 202 and to digital demodulator 206 by a connection 222 to provide a PN sequence and/or pn value to both analog modulator 202 and digital demodulator 206.

As shown for illustrative conceptualization, the input analog signal of SAR analog-to-digital conversion circuit 1300 may include noise component 232. While illustrated as being on first comparator input 1310, it will be understood by those of skill in the relevant art(s) having the benefit of this disclosure that noise component 232 may also, or alternatively, reside in second comparator input 1312 or on any or all portions of an analog signal, and that the illustrated embodiment is not limiting, but is for descriptive purposes only.

Analog modulator 202 may be configured to receive and modulate an analog signal received on first modulator input 210 and second modulator input 212. As noted above, the received input analog signal may be a differential signal. In embodiments, analog modulator 202 may be configured to modulate the input analog signal according to a PN sequence generated by PN generator 208 as described with respect to FIG. 2. Reference numerals for switching components of analog modulator 202 that are not shown in FIG. 13 are omitted for illustrative clarity, but are described in detail with respect to FIGS. 2 and 4, and are shown therein. Accordingly, analog modulator 202 may switch the differential signal portions of an analog signal received on first modulator input 210 and second modulator input 212 to either of first comparator input 1310 or second comparator input 1312, and the differential analog signal is thus modulated according to the PN sequence.

Comparator 1304 is configured to convert an analog signal to a digital representation of the analog signal. In embodiments, as shown in FIG. 13, comparator 1304 is configured to convert the modulated, differential input analog signal received on first comparator input 1310 or second comparator input 1312 to a modulated digital signal representation of the analog signal on a digital comparator output 1316. Comparator 1304 may be any comparator capable of performing an analog-to-digital conversion, e.g., of a differential input analog signal, for SAR circuit implementations as will become apparent to one of skill in the relevant art(s) having the benefit of this disclosure.

SAR logic 1318 is configured to receive the output signal of comparator 1304 on digital comparator output 1316 and to generate a modulated digital output signal on SAR output 1314 according to SAR operations (i.e., using successive approximation techniques). As noted above, SAR logic 1318 also outputs a CDAC control signal on CDAC control connection 1320 that may include a successive approximation value as described herein. SAR logic 1318 may be any SAR implementation comprising successive approximation registers as would be understood by a person of skill in the relevant art(s) having the benefit of this disclosure. For example, in embodiments, SAR logic 1318 may comprise a plurality of registers corresponding to signal levels of an analog input signal. SAR logic 1318 may iteratively, e.g., via binary search operation, receive the output of comparator 1304 corresponding to signal levels for each register in SAR logic 1318. For each comparison by comparator 1304, SAR logic may set a value in the register corresponding to the signal level of the current successive approximation iteration, and provide an associated value back to CDAC 1302 via CDAC control connection 1320 for use in subtraction operations as described above. SAR logic 1318 is thus configured to converge on an analog signal value using the described binary search iteration, and to generate a modulated digital output signal on SAR output 1314 representative of the input analog signal upon convergence.

Digital demodulator 206 is configured to receive and demodulate the modulated digital signal on SAR output 1314. In embodiments, digital demodulator 206 may be configured to demodulate the digital signal according to the PN sequence generated by PN generator 208 that was used to modulate the analog signal. By demodulating the digital signal using the same PN sequence that was used to modulate the signal, the original signal values may thus be obtained in the digital domain while generating a noise-spread signal with reduced spectral noise density.

PN generator 208 is configured to generate a pseudo-noise (PN) sequence as described herein. The generated PN sequence may be used to modulate and/or demodulate signals according to embodiments. For example, analog modulator 202 and/or digital demodulator 206 may perform modulation and demodulation of signals, respectively, according to the generated PN sequence. In embodiments, a derivation or representation of the PN sequence such as a pn value may be used by analog modulator 202 and/or digital demodulator 206 for respective modulation and demodulation of signals.

Figure 14:
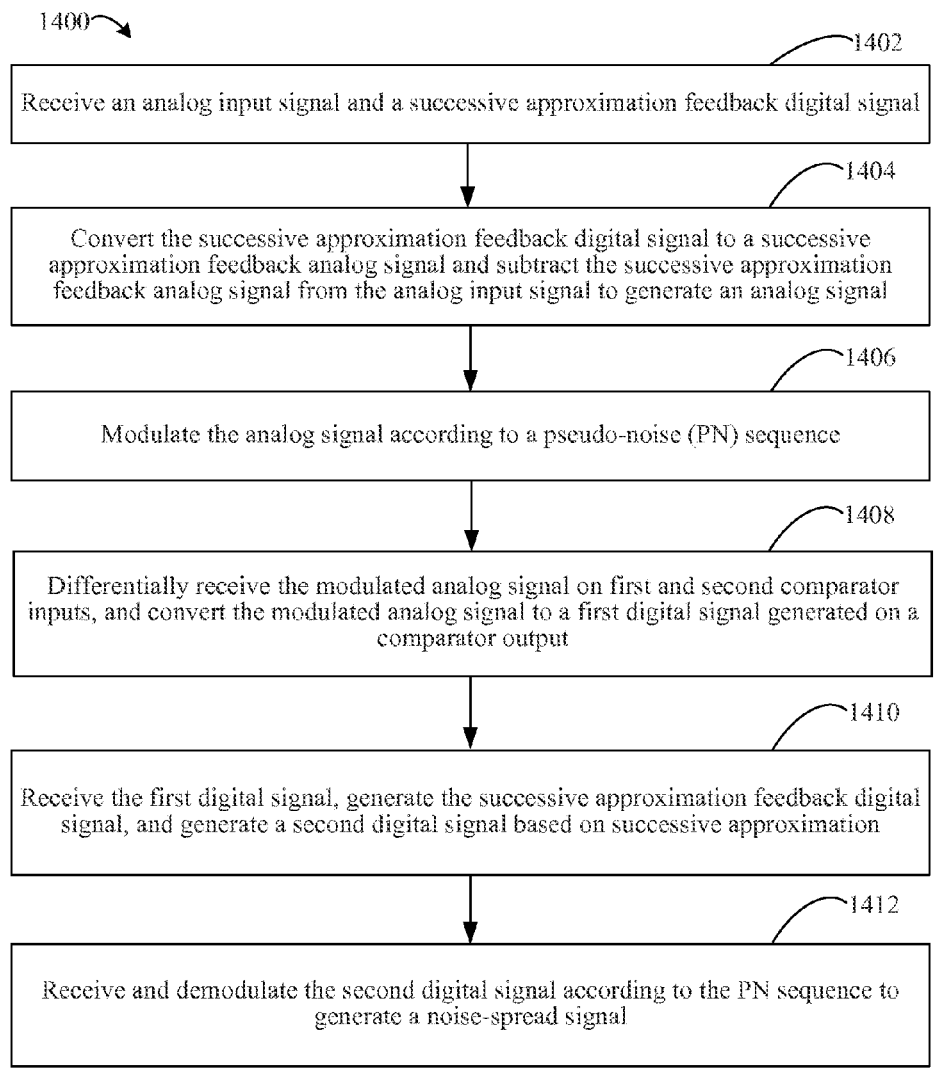
FIG. 14 shows a flowchart providing a process for performing spread spectrum ADC noise reduction, according to an example embodiment.

Turning now to FIG. 14, a flowchart 1400 according to which example embodiments herein are configured to perform is shown. For instance, SAR analog-to-digital conversion circuit 1300, along with any subcomponents thereof, may be configured to perform spread spectrum noise reduction according to flowchart 1400. Flowchart 1400 is described as follows.

In flowchart 1400, an analog input signal and a successive approximation feedback digital signal are received (1402). For example, an analog signal may be differentially received by CDAC 1302 on first CDAC input 1306 and on second CDAC input 1308, and a successive approximation feedback digital signal may be received by CDAC 1302 from SAR logic 1318 on CDAC control connection 1320 (e.g., as in 1410 below).

The successive approximation feedback digital signal is converted to an analog signal, and the successive approximation feedback analog signal is subtracted from the analog input signal to generate an analog signal (1404). For instance, a DAC of CDAC 1302 may convert a successive approximation feedback digital signal on CDAC control connection 1320 (e.g., as in 1410 below) to a successive approximation feedback analog signal. A differential subtractor of CDAC 1302 may subtract the successive approximation feedback analog signal from the analog input signal. CDAC 1302 may differentially output the resulting, generated analog signal, after the subtraction, to be received by analog modulator 202.

The analog signal is modulated using a pseudo-noise (PN) sequence (1406). In embodiments, the analog signal is modulated by analog modulator 202 according to the pseudo-noise (PN) sequence as described in embodiments herein. Analog modulator 202 may be configured to modulate the analog signal by alternating provision of portions of the input analog signal between the first and second inputs of comparator 1304.

The modulated analog signal is differentially received on first and second comparator inputs, and is converted to a first digital signal generated on a comparator output (1408). For example, the modulated analog signal may be differentially received on the first and second comparator inputs 1310/1312 of comparator 1304. As described herein, different portions of the analog signal may be received by the first and second comparator inputs according to modulation configurations of analog modulator 202 that are driven according to the PN sequence. Comparator 1304 is configured to output a first digital signal on digital comparator output 1316 that is a representation of the received modulated analog signal.

The first digital signal is received, the successive approximation feedback digital signal is generated, and a second digital signal is generated based on successive approximation (1410). For instance, the first digital signal (e.g., in 1408) may be received by SAR logic such as SAR logic 1318 on digital comparator output 1316. As described above with respect to FIG. 13, SAR logic 1318 may set a value(s) in a register(s) corresponding to analog input signal levels based on the output of comparator 1304, and provide the value(s) to CDAC 1318 for subtraction (e.g., in 1404) as described herein. Furthermore, using successive approximation (e.g., by iterative binary search), SAR logic 1318 may generate a second digital signal on SAR output 1314 that is a further representation of the received modulated analog signal.

The second digital signal is received and demodulated according to the PN sequence to generate a noise-spread signal (1412). In embodiments, the second digital signal (e.g., in 1410) may be received and demodulated according to the PN sequence by digital demodulator 206 to generate to noise-spread signal as an output of digital demodulator 206. The noise-spread signal may thus be a representation of the analog input signal in the digital domain, having a reduced noise spectral density.

In some example embodiments, one or more of 1402, 1404, 1406, 1408, 1410, and/or 1412 of flowchart 1400 may not be performed. Moreover, capabilities in addition to or in lieu of 1402, 1404, 1406, 1408, 1410, and/or 1412 may be performed. Further, in some example embodiments, one or more of the capabilities in 1401402, 1404, 1406, 1408, 1410, and/or 1412 may be performed out of order, in an alternate sequence, or partially (or completely) concurrently with each other or with other capabilities.

It is contemplated that other flowcharts described herein may include capabilities that may be adapted to operation of SAR analog-to-digital conversion circuit 1300 and to flowchart 1400 described in this Section. For instance, flowcharts describing PN sequence and pn value generation, modulation, and/or DC offset removal with respect to embodiments in other Sections may be adapted to the SAR circuit embodiments as would be apparent to one of skill in the relevant art(s) having the benefit of this disclosure.

VI. Example Computer Implementations

Circuit 100, analog-to-digital conversion circuit 200, DC offset analog-to-digital conversion circuit 1000, interleaved analog-to-digital conversion circuit lanes 1200, SAR analog-to-digital conversion circuit 1300, and/or any circuit or flowchart described herein, along with any subcomponents thereof, and/or any further systems, sub-systems, and/or components disclosed herein may be implemented in hardware (e.g., hardware logic/electrical circuitry), or any combination of hardware with software (computer program code or instructions configured to be executed in one or more processors or processing devices) and/or firmware.

Figure 15:
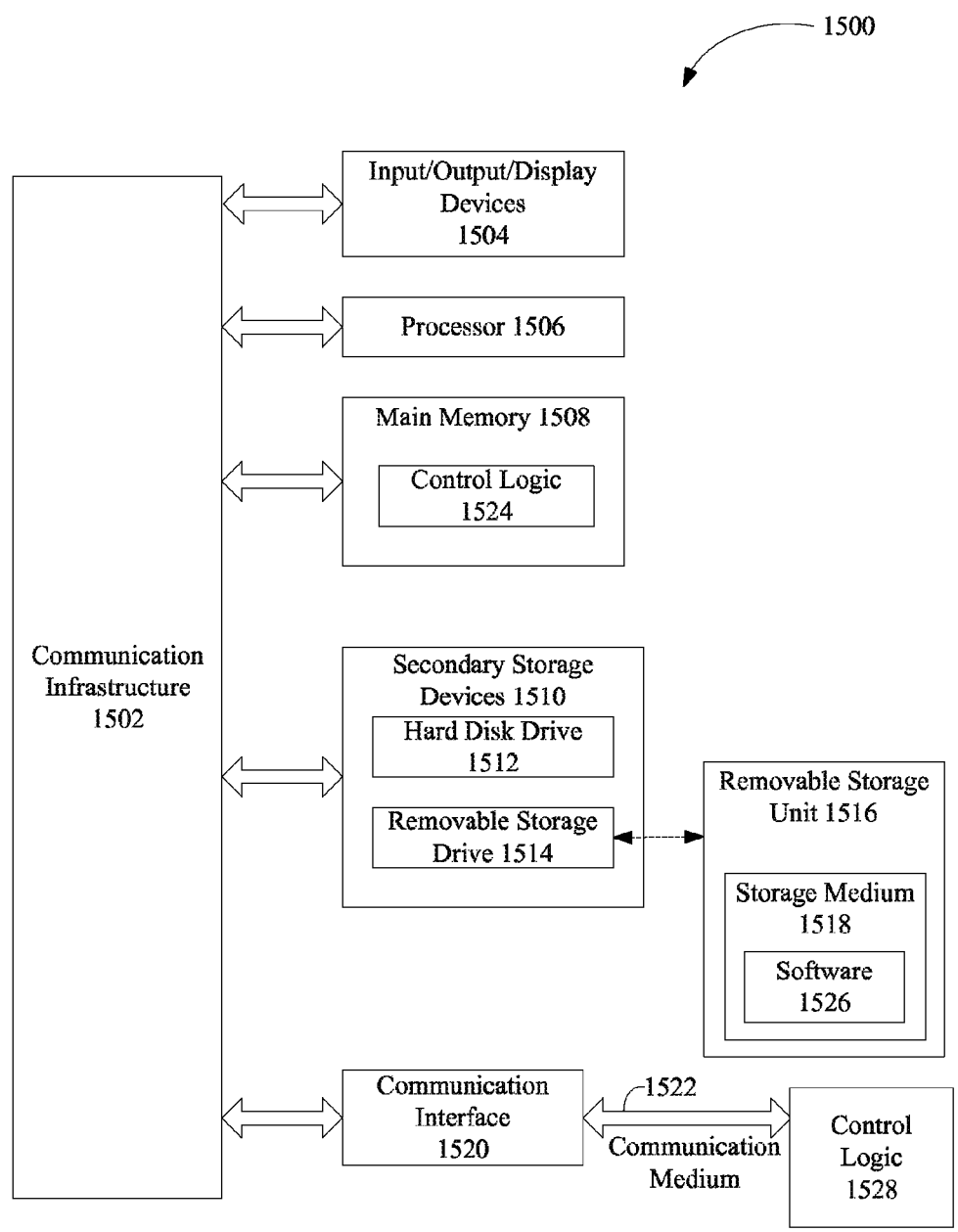
FIG. 15 shows a block diagram of a processing device/system that may be configured to perform techniques disclosed herein.

The embodiments described herein, including systems, methods/processes, and/or apparatuses, may be implemented in or using well known processing devices, telephones (land line based telephones, conference phone terminals, smart phones and/or mobile phones), home entertainment systems, communication systems, servers, and/or, computers, such as a processing device 1500 shown in FIG. 15. It should be noted that processing device 1500 may represent communication devices/systems, entertainment systems/devices, processing devices, and/or traditional computers in one or more embodiments. For example, analog-to-digital conversion circuits for spread spectrum noise reduction, and any of the sub-systems and/or components respectively contained therein and/or associated therewith, may be implemented in or using one or more processing device 1500s and similar computing devices.

Processing device 1500 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1500 may be any type of computer, including a desktop computer, a server, etc., and may be a computing device or system within another device or system.

Processing device 1500 includes one or more processors (also called central processing units, or CPUs), such as a processor 1506. Processor 1506 is connected to a communication infrastructure 1502, such as a communication bus. In some embodiments, processor 1506 can simultaneously operate multiple computing threads, and in some embodiments, processor 1506 may comprise one or more processors.

Processing device 1500 also includes a primary or main memory 1508, such as random access memory (RAM). Main memory 1508 has stored therein control logic 1524 (computer software), and data.

Processing device 1500 also includes one or more secondary storage devices 1510. Secondary storage devices 1510 include, for example, a hard disk drive 1512 and/or a removable storage device or drive 1514, as well as other types of storage devices, such as memory cards and memory sticks. For instance, processing device 1500 may include an industry standard interface, such a universal serial bus (USB) interface for interfacing with devices such as a memory stick. Removable storage drive 1514 represents a floppy disk drive, a magnetic tape drive, a compact disk drive, an optical storage device, tape backup, etc.

Removable storage drive 1514 interacts with a removable storage unit 1516. Removable storage unit 1516 includes a computer useable or readable storage medium 1518 having stored therein computer software 1526 (control logic) and/or data. Removable storage unit 1516 represents a floppy disk, magnetic tape, compact disk, DVD, optical storage disk, or any other computer data storage device. Removable storage drive 1514 reads from and/or writes to removable storage unit 1516 in a well-known manner.

Processing device 1500 also includes input/output/display devices 1504, such as touchscreens, LED and LCD displays, monitors, keyboards, pointing devices, etc.

Processing device 1500 further includes a communication or network interface 1520. Communication interface 1520 enables processing device 1500 to communicate with remote devices. For example, communication interface 1520 allows processing device 1500 to communicate over communication networks or mediums 1522 (representing a form of a computer useable or readable medium), such as LANs, WANs, the Internet, etc. Network interface 1520 may interface with remote sites or networks via wired or wireless connections.

Control logic 1528 may be transmitted to and from processing device 1500 via the communication medium 1522.

Any apparatus or manufacture comprising a computer useable or readable medium having control logic (software) stored therein is referred to herein as a computer program product or program storage device. This includes, but is not limited to, processing device 1500, main memory 1508, secondary storage devices 1510, and removable storage unit 1516. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of devices. For instance, embodiments may be included, without limitation, in processing devices (e.g., illustrated in FIG. 15) such as mobile devices such as laptop computers, handheld devices such as mobile phones (e.g., cellular and smart phones), handheld computers, and further types of mobile devices, stationary devices such as gaming consoles and desktop computers, cable modems, cable set-top boxes, satellite set-top boxes, satellite ODU, terrestrial TVs, technologies for Multimedia over Coax Alliance (MoCA), uWave, and Wi-Fi, cellular handsets, cellular base stations, universal radio frequency (RF) technologies, 10 Gb Ethernet, products and services in markets that employ Full-Band Capture (FBC) technologies, as well as car entertainment/navigation systems. A device, as defined herein, is a machine or manufacture as defined by 35 U.S.C. §101. Devices may include digital circuits, analog circuits, or a combination thereof. Devices may include one or more processor circuits (e.g., central processing units (CPUs), processor 1506 of FIG. 15), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

VII. Further Example Embodiments and Advantages

Embodiments and techniques, including methods, described herein may be performed in various ways such as, but not limited to, being implemented by hardware, software, firmware, and/or any combination thereof.

Performance of the described embodiments and techniques herein provide for the flattening or spreading of noise spectral density for ADC noise and ADC "1/f" noise (i.e., low-frequency noise).

The inventive techniques and embodiments, while supporting Nyquist and interleaved ADCs, also provide for higher narrow-band signal-to-noise ratios (SNRs) and channel SNRs. For instance, in embodiments, an SNR that is 20 dB higher is possible. The inventive techniques and embodiments also provide for higher operating speeds and lower power consumption compared to prior solutions for sizing up transistors and for auto-zeroing. For example, speed increases of double or more, and reductions in power consumption by half or more are possible, according to embodiments. The inventive techniques and embodiments also provide for smaller circuit areas compared to previous solutions for sizing up, where a 4× decrease in area for 6 dB (based on $n^2=kf/WL$, where kf is the noise coefficient and WL is the aspect ratio) is also possible. Higher ADC sample rates are also achieved according to the inventive techniques and embodiments as they allow for interleaving without adverse effects from 1/f noise up-conversion (Nx). Additionally, the techniques and embodiments described herein provide lower bit error rates for successive approximation register (SAR) implementations, e.g., lower by an order of magnitude related to noise and speed.

System and product level advantages of the described techniques and embodiments include higher channel SNR in communication systems (up to 20 dB or more possible), and large-scale interleaving to achieve very high sample rates in interleaved systems (greater than 40 GS/s), according to the described embodiments and techniques. Overall product costs are also reduced by reducing circuit area, and products requiring high, low-frequency SNR, high narrow-band SNR, or very high sample rates are enabled.

Embodiments and techniques described herein may be performed in various ways such as, but not limited to, being implemented by hardware, software, firmware, and/or any combination thereof. For example, embodiments may be implemented as specifically customized hardware or electrical circuitry.

VIII. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. An analog-to-digital conversion circuit that comprises:
an analog modulator configured to receive and modulate an input analog signal according to a pseudo-noise (PN) sequence;
an analog-to-digital converter (ADC) core that includes a first analog input, a second analog input, and a digital output, the ADC core being configured to differentially receive the modulated input analog signal on the first and second analog inputs, and to convert the modulated input analog signal to a digital signal generated on the digital output; and
a digital demodulator configured to receive and demodulate the digital signal according to the PN sequence to generate a noise-spread signal;
wherein at least one of:
the analog modulator modulates the input analog signal based on a plurality of switches controlled by the PN sequence; or
the analog-to-digital conversion circuit removes a direct current (DC) offset from the digital signal on the digital output.

2. The analog-to-digital conversion circuit of claim 1, further comprising:
a digital offset canceller configured to:
receive the digital signal; and
remove the DC offset from the digital signal to form a non-offset digital signal, wherein the non-offset digital signal is received and demodulated by the digital demodulator according to the PN sequence to generate the noise-spread signal.

3. The analog-to-digital conversion circuit of claim 1, wherein the analog modulator comprises:
the plurality of switches controlled by the PN sequence, the plurality of switches being configured to:
operate in one or more configurations according to the PN sequence;
receive the input analog signal in the one or more configurations; and
generate a modulated representation of the input analog signal as the modulated input analog signal.

4. The analog-to-digital conversion circuit of claim 3, wherein the input analog signal is a differential analog signal that comprises a positive portion and a negative portion, and wherein the first analog input is a positive input and the second analog input is a negative input of the ADC core.

5. The analog-to-digital conversion circuit of claim 4, wherein the plurality of switches of the analog modulator comprises:
a first modulator switch and a second modulator switch that are each configured to receive the positive portion; and
a third modulator switch and a fourth modulator switch that are each configured to receive the negative portion.

6. The analog-to-digital conversion circuit of claim 5, where in a first configuration of the one or more configurations:

the first analog input receives the positive portion from the first modulator switch and the second analog input receives the negative portion from the fourth modulator switch; and where in a second configuration of the one or more configurations:

the second analog input receives the positive portion from the second modulator switch and the first analog input receives the negative portion from the third modulator switch.

7. The analog-to-digital conversion circuit of claim 1, further comprising:

a PN generator configured to generate the PN sequence received by at least one of the analog modulator or the digital demodulator.

8. The analog-to-digital conversion circuit of claim 1, wherein the ADC core is a Nyquist ADC core configured to sample the input analog signal at a Nyquist rate.

9. An interleaved analog-to-digital conversion circuit that comprises:

a plurality of interleaved data lanes, wherein each data lane includes an analog-to-digital conversion circuit that comprises:

an analog modulator configured to modulate an input analog signal according to a respective pseudo-noise (PN) sequence;

an analog-to-digital converter (ADC) core that includes a first analog input, a second analog input, and a digital output, the ADC core being configured to differentially receive the modulated input analog signal on the first and second analog inputs, and to convert the modulated input analog signal to a digital signal generated on the digital output; and a digital demodulator configured to receive and demodulate the digital signal according to the respective PN sequence to generate a noise-spread signal;

wherein at least one of:

the analog modulator modulates the input analog signal based on a plurality of switches controlled by the PN sequence; or the analog-to-digital conversion circuit removes a direct current (DC) offset from the digital signal.

10. The interleaved analog-to-digital conversion circuit of claim 9, further comprising:

at least one PN generator configured to generate the PN sequences, for the plurality of interleaved data lanes, that are received by at least one of the analog modulators or digital demodulators of the plurality of interleaved data lanes.

11. The interleaved analog-to-digital conversion circuit of claim 9, each data lane of the plurality of interleaved data lanes further comprising:

a PN generator configured to generate the respective PN sequence, for its associated data lane, that is received by at least one of the associated analog modulators or the associated digital demodulators of its associated data lane.

12. The interleaved analog-to-digital conversion circuit of claim 11, each data lane of the plurality of interleaved data lanes further comprising:

a digital offset canceller configured to:

receive the digital signal from the ADC core; and remove the DC offset from the digital signal to form a non-offset digital signal, wherein the non-offset digital signal is received and demodulated by the digital demodulator according to the respective PN sequence to generate the noise-spread signal.

13. The interleaved analog-to-digital conversion circuit of claim 9, wherein for each data lane of the plurality of interleaved data lanes:

the input analog signal is a differential analog signal that comprises a positive portion and a negative portion, the first analog input is a positive input and the second analog input is a negative input of the ADC core, and the analog modulator comprises:

the plurality of switches controlled by the respective PN sequence of its associated data lane, the plurality of switches being configured to:

operate in one or more configurations according to the respective PN sequence;

receive the input analog signal in the one or more configurations; and generate a modulated representation of the input analog signal as the modulated input analog signal.

14. The interleaved analog-to-digital conversion circuit of claim 13, wherein for each data lane of the plurality of interleaved data lanes:

the analog modulator includes a first modulator switch and a second modulator switch that are each configured to receive the positive portion; and a third modulator switch and a fourth modulator switch that are each configured to receive the negative portion.

15. The interleaved analog-to-digital conversion circuit of claim 14, wherein the analog modulator of each data lane of the plurality of interleaved data lanes is configured to:

in a first configuration of the one or more configurations:

receive at the first analog input the positive portion from the first modulator switch, and receive at the second analog input the negative portion from the fourth modulator switch; and in a second configuration of the one or more configurations:

receive at the second analog input the positive portion from the second modulator switch, and receive at the first analog input the negative portion from the third modulator switch.

16. The interleaved analog-to-digital conversion circuit of claim 9, wherein the analog modulator and the digital demodulator of each interleaved data lane are configured to reduce a low-frequency noise spectral density for a signal spectrum across the plurality of interleaved data lanes based on the PN sequence.

17. A successive approximation analog-to-digital conversion circuit that comprises:

a digital-to-analog converter (DAC) configured to:

receive an analog input signal a successive approximation feedback digital signal;

convert the successive approximation feedback digital signal to a successive approximation feedback analog signal; and subtract the successive approximation feedback analog signal from the analog input signal to generate an analog signal;

an analog modulator configured to receive and modulate the analog signal according to a pseudo-noise (PN) sequence;

a comparator that includes a first comparator input, a second comparator input, and a digital comparator output, the comparator configured to differentially receive the modulated analog signal on the first and second comparator inputs, and to convert the modulated analog signal to a first digital signal generated on the digital comparator output;

successive approximation register logic configured to:
  receive the first digital signal;
  generate the successive approximation feedback digital signal; and
  generate a second digital signal based on successive approximation; and a digital demodulator configured to receive and demodulate the second digital signal according to the PN sequence to generate a noise-spread signal.

18. The successive approximation analog-to-digital conversion circuit of claim 17, further comprising:
  a digital offset canceller configured to:
    receive the second digital signal; and
    remove a direct current (DC) offset from the second digital signal to form a non-offset digital signal, wherein the non-offset digital signal is received and demodulated by the digital demodulator according to the PN sequence to generate the noise-spread signal.

19. The successive approximation analog-to-digital conversion circuit of claim 17, wherein the analog input signal is a differential analog signal that comprises a positive portion and a negative portion;
  wherein the first comparator input is a positive input and the second comparator input is a negative input,
  where in a first configuration that is based on a first value of the PN sequence:
    the first comparator input receives the positive portion from the analog modulator, and the second comparator input receives the negative portion from the analog modulator, and
  where in a second configuration that is based on a first value of the PN sequence:
    the second comparator input receives the positive portion from the analog modulator, and the first comparator input receives the negative portion from the analog modulator.

20. The successive approximation analog-to-digital conversion circuit of claim 17, further comprising:
  a PN generator configured to generate the PN sequence received by at least one of the analog modulator or the digital demodulator, the PN sequence comprising a representation of a square wave signal.

* * * * *

UNITED STATES PATENT AND TRADEMARK OFFICE
CERTIFICATE OF CORRECTION

PATENT NO. : 9,455,733 B1  
APPLICATION NO. : 14/699866  
DATED : September 27, 2016  
INVENTOR(S) : Jiangfeng Wu Page 1 of 1

It is certified that error appears in the above-identified patent and that said Letters Patent is hereby corrected as shown below:

In the Claims

In Column 26, Line 54, in Claim 17, after "signal" insert -- and --.

Signed and Sealed this  
Thirty-first Day of January, 2017

Michelle K. Lee  
*Director of the United States Patent and Trademark Office*